(12) United States Patent
Capellmann et al.

(10) Patent No.: US 8,261,720 B2
(45) Date of Patent: Sep. 11, 2012

(54) PIEZOELECTRIC ACTUATOR WITH A SHEATHING COMPOSED OF A COMPOSITE MATERIAL

(75) Inventors: Rainer Capellmann, Wuerselen (DE); Gregor Renner, Stuttgart (DE); Holger Stark, Allmersbach im Tal (DE)

(73) Assignee: Daimler AG, Suttgart (DE)

( * ) Notice: Subject to any disclaimer, the term of this patent is extended or adjusted under 35 U.S.C. 154(b) by 655 days.

(21) Appl. No.: 12/298,897

(22) PCT Filed: Apr. 5, 2007

(86) PCT No.: PCT/EP2007/003084
§ 371 (c)(1),
(2), (4) Date: Aug. 11, 2009

(87) PCT Pub. No.: WO2007/124842
PCT Pub. Date: Nov. 8, 2007

(65) Prior Publication Data
US 2010/0031929 A1    Feb. 11, 2010

(30) Foreign Application Priority Data

Apr. 28, 2006  (DE) .................. 10 2006 020 330
Jun. 2, 2006    (DE) .................. 10 2006 025 820

(51) Int. Cl.
*F02M 51/00*   (2006.01)
*H01L 41/00*   (2006.01)
*H02N 2/00*    (2006.01)

(52) U.S. Cl. ...................................... 123/472; 310/328

(58) Field of Classification Search ................. None
See application file for complete search history.

(56) References Cited

U.S. PATENT DOCUMENTS

| | | | |
|---|---|---|---|
| 4,553,059 A | 11/1985 | Abe et al. | |
| 6,700,308 B2 * | 3/2004 | Heinz | 310/328 |
| 7,250,709 B2 | 7/2007 | Flaemig-Vetter et al. | |
| 7,564,175 B2 * | 7/2009 | Stier et al. | 310/348 |
| 7,851,979 B2 * | 12/2010 | Kronberger | 310/366 |
| 2005/0072863 A1 * | 4/2005 | Bachmaier et al. | 239/584 |
| 2009/0102320 A1 * | 4/2009 | Mattes | 310/328 |

FOREIGN PATENT DOCUMENTS

| | | |
|---|---|---|
| DE | 19753930 A1 | 6/1999 |
| DE | 10053928 A1 | 5/2002 |
| DE | 10230032 A1 | 1/2004 |
| JP | 01137686 | 5/1989 |
| JP | 02094680 | 4/1990 |
| WO | WO 2007090698 A1 * | 8/2007 |
| WO | WO 2007131965 A1 * | 11/2007 |

OTHER PUBLICATIONS

International Search Report, Nov. 15, 2007 (13 pages).

* cited by examiner

*Primary Examiner* — Stephen K Cronin
*Assistant Examiner* — Sherman Manley
(74) *Attorney, Agent, or Firm* — Crowell & Moring LLP

(57) ABSTRACT

A piezoelectric actuator for flowing-around media, with a piezo element arranged between two end caps. The piezo element is surrounded by a ring-shaped sheathing connected to the end caps. The sheathing consists, at least in portions, of a composite material with at least two layers, at least one layer consisting of a metallic material and at least one layer consisting of a polymer.

6 Claims, 2 Drawing Sheets

PIEZOELECTRIC ACTUATOR WITH A SHEATHING COMPOSED OF A COMPOSITE MATERIAL

This application is a national stage of International Application No. PCT/EP/2007/003084, filed Apr. 5, 2007, which claims priority under 35 U.S.C. §119 to German Patent Application Nos. 10 2006 020 300.5, filed Apr. 28, 2006 and 10 2006 025 820.7, filed Jun. 2, 2006, the entire disclosures of which are herein expressly incorporated by reference.

BACKGROUND AND SUMMARY OF THE INVENTION

The invention relates to a piezoelectric actuator for high pressure media which flow around it.

In order to reduce the emissions of internal combustion engines, injection systems are increasingly used for the fuel supply, in which fuel is conveyed with the aid of a high-pressure pump into an accumulator and is injected from there into the combustion space with the aid of an injector. The activation of the injector takes place by means of an electrically activated actuator, preferably a piezoelectric actuator. On account of the very short switching times of such piezoelectric actuators, the injection operations can be controlled and metered with high accuracy; in particular, when piezoelectric actuators are employed, a plurality of nozzle needle strokes (injection operations) per engine revolution are possible.

A piezoelectric actuator contains a piezo element consisting of quartz ceramic or PZT ceramic (lead/zirconate/titanate ceramic), the active main faces of which are connected to an actuator cover and the actuator bottom. By an electrical voltage being applied to the actuator cover or actuator bottom, the length of the piezo element can be varied. This length change is transmitted, during operation, to a valve in the fuel injector.

The problem is that the piezoelectric actuator is often in direct contact with the media or fuel, since it is arranged in the pressure space of the injector and fuel under a high hydrostatic pressure washes around it there. In order to prevent oil or fuel from penetrating into the interior of the piezoelectric actuator, therefore, the latter has to be provided with a protective or sealing-off arrangement. This may, for example, be a sleeve-shaped housing jacket which is fastened on the end face to the actuator bottom and to the actuator cover respectively. In the German patent document DE 102 30 032 A1, to protect the piezoelectric actuator against media flowing around it, it is proposed to provide the actuator with a sheathing composed of an electrically insulating, flaccid and/or elastic material which surrounds the piezo element. Furthermore, it is known from (German patent application 10 2006 012 845.1) to configure the sheathing as a shrunk-on hose which is firmly pressed on the end faces against the outer circumference of the actuator bottom and of the actuator cover with the aid of peripheral ring elements.

By means of a sheathing composed of an electrically insulating material, in particular of a shrunk-on film, the piezo element can, indeed, be protected against the fuel which washes around the actuator (and which is under high pressure). However, a completely diffusion-tight sheathing often cannot be implemented by means of such polymer films.

One object of the invention, therefore, is to provide a piezoelectric actuator of the type described above, in which the piezo element of the actuator is effectively protected against flowing-around media.

This and other objects and advantages are achieved by the piezoelectric actuator according to the invention, in which the sheathing consists, at least in portions, of a composite material with at least two layers, at least one layer consisting of a metallic material and at least one layer consisting of a polymer. Such a composite material is electrically conductive; the sheathing can therefore be wired up electrically (in particular, by grounding the sheathing) in such a way that it is impossible for ions to penetrate the sheathing. The sheathing thus constitutes a diffusion-tight protective layer and protects the piezo element against penetrating liquids, in particular against fuel, water and ions.

On the other hand, the polymer layer of the composite material can be configured in such a way that it ensures a chemical passivity of the sheathing.

The sheathing has to satisfy high requirements: it must protect the piezo element effectively against penetrating media (fuel, water, ions, etc.) and, particularly also in the joining region between the sheathing film and end caps, ensure permanent diffusion tightness. Furthermore, even under cyclic load, it must be insensitive to the hydrostatic pressure acting in the pressure space, that is to say must possess a sufficient expansion capacity and high elasticity. Such properties must be ensured within the overall temperature range of between −40° C. and 120° C.

In order to fulfill these high requirements, the use of a composite material for the sheathing offers the possibility of suitably selecting or adapting the number, sequence and thickness of the individual layers. Furthermore, the metal layer and/or the polymer layer of the sheathing may be provided with reinforcing fabrics and/or fibers. Moreover, the composite material of the sheathing may have, in addition to the at least one polymer layer and one metal layer, further layers (consisting, in particular, of paper and/or cardboard and/or fabric and/or fibers) which in this case each perform a particular function. Layers or layer systems into which ion getters are implanted may also be used. In an advantageous combination of individual layers, it is possible to cover the entire requirement spectrum of the sheathing.

The metallic layer or metallic layers of the composite material may, in particular, be roll-bonded or electrodeposited or generated by means of physical vapor deposition (PVD) or chemical vapor deposition (CVD).

A major advantage of using composite materials is the possibility of applying or processing coatings which could not be applied or could not be used as individual layers standing alone so as to ensure process reliability. One example of this is metal films consisting of pure aluminum or aluminum alloys, which can be produced in a film thickness of 6 μm, but, with this low layer thickness, cannot fulfill the requirements placed on an actuator sheathing or cannot be applied reliably; if, however, such a thin aluminum film is drawn onto a tear-resistant, expandable polymer film, the composite material which in this case occurs is suitable for actuator sheathing.

Furthermore, by an advantageous combination and sequence of the various layers in the composite material, it is possible to achieve properties or functions which are possible only due to this combination. Thus, for example, an aluminum-coated polymer film has an increased expansion and shear capacity, as compared with a pure aluminum film.

In an advantageous refinement of the invention, the sheathing comprises a (sheathing) film composed of a composite material, which film is connected, diffusion-tight, to the end caps of the actuator. In this context, "film" is to be understood as meaning a sheet-like, flexible material portion expandable or elastic within certain limits and having a small wall thickness. The sheathing film seals off the inner space of the sleeve with respect to the outside space and therefore protects the piezo element from the flowing-around media, such as fuel or fuel constituents and water. On account of its elastic properties, it allows pressure compensation between the actuator inner space, enclosed by the sheathing film, and the surroundings.

In a further advantageous refinement of the invention, the sheathing comprises a sleeve having locally delimited perforations which are spanned by an elastic and expandable film connected sealingly to the sleeve. The film seals off the inner space of the sleeve with respect to the outside space and therefore protects the piezo element against the flowing-around media, such as fuel or fuel constituents and water. At the same time, because of its elastic expandable properties, the film allows pressure compensation between the two spaces even in the case of high ambient pressures (up to 2000 bar). The sleeve and/or the film in this case consist/consists of a composite material.

As is known from German patent document 10 2006 012 845.1, the sheathing may be fastened to the end caps of the actuator by means of ring-shaped clamping elements. Alternatively, the sheathing may be adhesively bonded to the end caps or be connected to the end caps by means of a soldered or welded joint (for example, WIG welding, laser or electron beam welding).

Other objects, advantages and novel features of the present invention will become apparent from the following detailed description of the invention when considered in conjunction with the accompanying drawings.

DETAILED DESCRIPTION OF THE DRAWINGS

Figure 1:
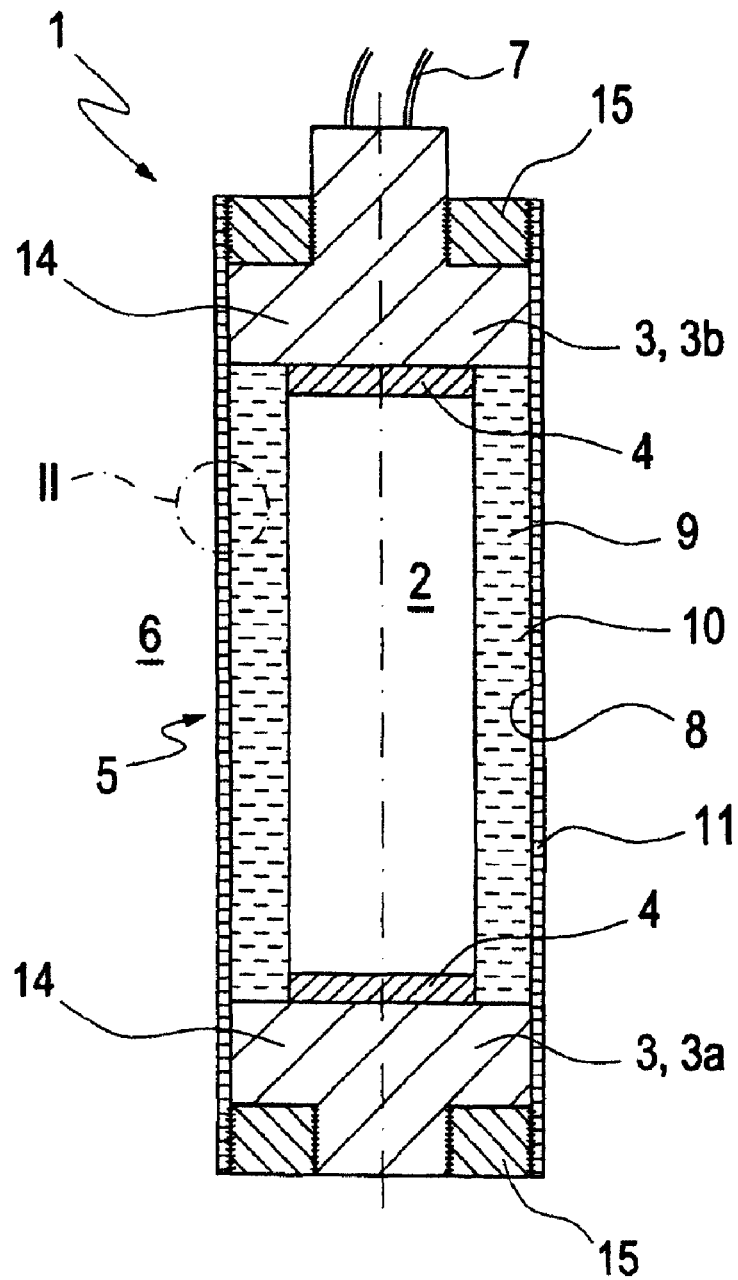
FIG. 1 shows a diagrammatic sectional illustration of a piezoelectric actuator according to the invention in a first embodiment.

FIG. 1 is a diagrammatic sectional illustration of a piezoelectric actuator 1 for actuating the injection valve of a fuel injector in an internal combustion engine. The basic set-up of such a fuel injector is explained, for example, in (German patent application 10 2006 012 845.1), the disclosure content of which is hereby incorporated into the present patent application. During operation, the actuator 1 is arranged in a pressure space 6 of the fuel injector and fuel which is under high pressure washes around it there.

The actuator 1 comprises two end caps 3, an actuator bottom 3a and an actuator cover 3b, between which a piezo element 2 is arranged. The piezo element 2 consists, for example, of a plurality of plies of piezo layers consisting of a piezoelectric ceramic and receives control signals from a control apparatus by means of electrical lines 7. The piezo element 2 is insulated electrically with respect to the end caps 3 by means of support plates 4 and is sealed off against the fuel in the pressure space 6 of the injector by means of a fuel-tight or fuel-repellent sheathing 5, with the result that electrical short circuits in the electrical components of the actuator 1 are avoided. In the exemplary embodiment illustrated here, a cavity 9 formed between the piezo element 2 and the inner wall 8 of the sheathing 5 is filled with an electrically insulating fluid 10, for example a silicone oil, so that pressure compensation between the inner space 9 and the outside space 6 can be made possible.

Figure 2:
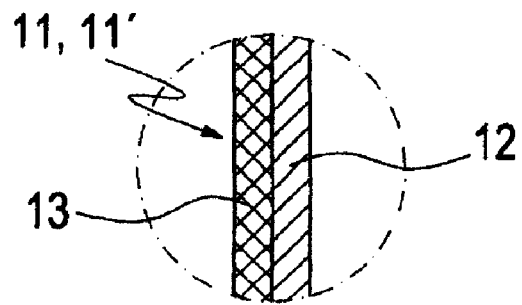
FIG. 2 shows an illustration of a detail of the sheathing of the actuator of FIG. 1.

The sheathing 5 comprises a sheathing film 11 composed of a composite material which comprises at least one metallic layer 12 (consisting, for example, of aluminum or of an aluminum alloy) and at least one polymer layer 13 (consisting, in particular, of a polymer) (see the illustration of a detail in FIG. 2). The sheathing film is electrically conductive, expandable and flexible.

In order to seal off, diffusion-tight, the inner space of the actuator 1 with respect to the pressure space 6, the sheathing film 11 is soldered peripherally to the end caps 3 of the actuator 1 in the exemplary embodiment illustrated here. In the present exemplary embodiment, the end caps 3 have ceramic basic bodies 14 provided with ring-shaped metal elements 15, to which the sheathing film 11 is soldered; the material (or a coating) of the metal element 15 is coordinated with the materials of the sheathing film 11 in such a way that a simple, diffusion-tight and permanent soldering of the sheathing film 11 to the metal element 15 can be ensured. Alternatively, the sheathing film may be welded, adhesively bonded or connected mechanically (for example, via a clamping connection having ring elements) to the end caps 3.

Figure 3:
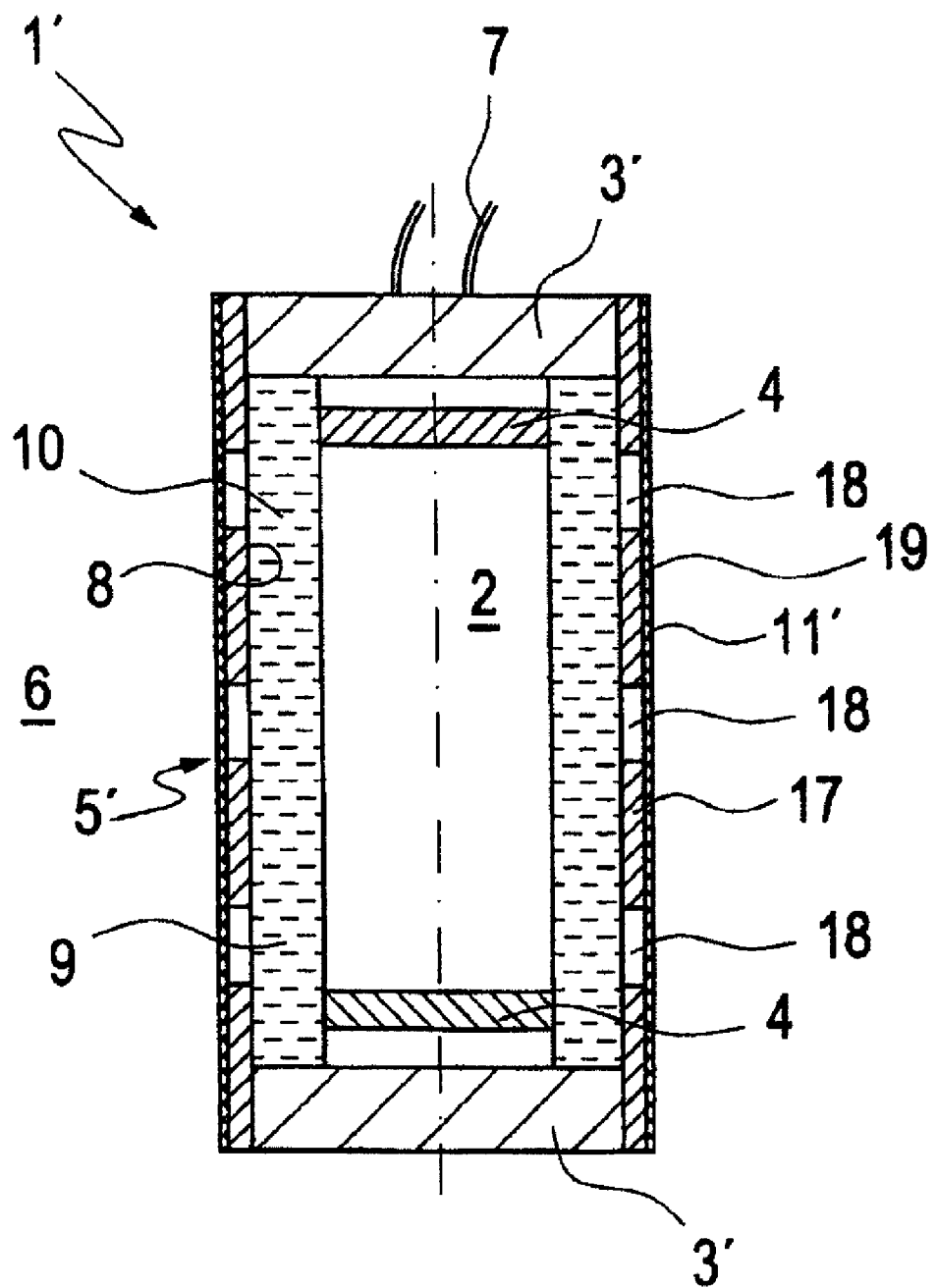
FIG. 3 shows a diagrammatic sectional illustration (detail) of a piezoelectric actuator according to the invention in an alternative embodiment.

FIG. 3 shows a further exemplary embodiment of the actuator 1' according to the invention. Here, the sheathing 5' comprises a cylindrical sleeve 17 consisting of a metal sheet, the wall of which is provided with perforations 18. The sleeve 17 surrounds the piezo element 2 and the support plates 4 of the actuator 1' completely and is welded, soldered, adhesively bonded or mechanically connected to the end caps 3'.

The sleeve 17 is looped around on the outside by a flexible and elastic film 19 composed of a composite material 11', said film lying flat on the outer wall of the sleeve 17; it spans the perforations 18 in the form of a membrane and, when the actuator 1 is in operation, serves the pressure compensation between the fluid 10 enclosed in the cavity 9 and the (high) pressure, acting on the actuator 1' from outside (that is to say, from the pressure space 6 of the injector), of the fuel to be injected. So that such pressure compensation can be mastered even under cyclic load and under high pressures in continuous operation, the composite material of the film 11' must possess a sufficiently high expansion capacity or elasticity.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A piezoelectric actuator for flowing-around media, said actuator comprising:
   a piezo element arranged between two end caps; and
   a ring-shaped sheathing which is connected on its end faces to the end caps, and which, at least in regions, surrounds the piezo element; wherein,
   the sheathing consists, at least in portions, of a composite material with at least two layers;
   at least one layer is made of a metallic material;
   at least one layer is made of a polymer; and
   the composite material contains at least one layer made of pure aluminum or of an aluminum alloy.

2. The piezoelectric actuator as claimed in claim 1, wherein the sheathing comprises an elastic and expandable sheathing film composed of a composite material with at least one metallic layer and with at least one polymer layer.

3. The piezoelectric actuator as claimed in claim 1, wherein
the sheathing comprises a sleeve which is provided in locally delimited regions with perforations; and
the perforations are spanned by an elastic and expandable film connected sealingly to the sleeve.

4. An injector of an internal combustion engine having a piezoelectric actuator as claimed in claim 1.

5. A piezoelectric actuator for flowing-around media, said actuator comprising:
   a piezo element arranged between two end caps; and
   a ring-shaped sheathing which is connected on its end faces to the end caps, and which, at least in regions, surrounds the piezo element; wherein,
   the sheathing consists, at least in portions, of a composite material with at least two layers;
   at least one layer is made of a metallic material;
   at least one layer is made of a polymer;
   the sheathing comprises a sleeve which is provided in locally delimited regions with perforations;
   the perforations are spanned by an elastic and expandable film connected sealingly to the sleeve; and
   the sleeve is made of a composite material with at least one metallic layer and with at least one polymer layer.

6. A piezoelectric actuator for flowing-around media, said actuator comprising:
   a piezo element arranged between two end caps; and
   a ring-shaped sheathing which is connected on its end faces to the end caps, and which, at least in regions, surrounds the piezo element; wherein,
   the sheathing consists, at least in portions, of a composite material with at least two layers;
   at least one layer is made of a metallic material;
   at least one layer is made of a polymer;
   the sheathing comprises a sleeve which is provided in locally delimited regions with perforations;
   the perforations are spanned by an elastic and expandable film connected sealingly to the sleeve; and
   the film is made of a composite material with at least one metallic layer and with at least one polymer layer.

\* \* \* \* \*